United States Patent
Kato et al.

(10) Patent No.: US 7,485,405 B2
(45) Date of Patent: Feb. 3, 2009

(54) PHOTO-CURABLE RESIN COMPOSITION COMPRISING A POLYIMIDE, A PROCESS FOR FORMING A PATTERN THEREWITH, AND A SUBSTRATE PROTECTING FILM

(75) Inventors: Hideto Kato, Takasaki (JP); Michihiro Sugo, Annaka (JP); Tomoyuki Goto, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 338 days.

(21) Appl. No.: 11/245,019

(22) Filed: Oct. 7, 2005

(65) Prior Publication Data

US 2006/0079658 A1    Apr. 13, 2006

(30) Foreign Application Priority Data

Oct. 7, 2004 (JP) .............................. 2004-294470
Oct. 5, 2005 (JP) .............................. 2005-293029

(51) Int. Cl.
G03F 7/00 (2006.01)
G03F 7/004 (2006.01)

(52) U.S. Cl. .................... 430/270.1; 430/906; 430/913; 430/964; 528/10; 528/310

(58) Field of Classification Search .............. 430/270.1, 430/906, 913, 964; 528/10, 310
See application file for complete search history.

(56) References Cited

U.S. PATENT DOCUMENTS

| 3,953,877 | A | 4/1976 | Sigusch et al. |
|---|---|---|---|
| 4,243,743 | A | 1/1981 | Hiramoto et al. |
| 4,339,521 | A | 7/1982 | Ahne et al. |
| 6,001,534 | A | 12/1999 | Kato |
| 6,605,353 | B2 | 8/2003 | Okada et al. |
| 2004/0019174 | A1* | 1/2004 | Ichiroku et al. ................ 528/25 |

FOREIGN PATENT DOCUMENTS

| EP | 0 424 940 A2 | 5/1991 |
|---|---|---|
| JP | 54-145794 A | 11/1979 |
| JP | 55-45746 A | 3/1980 |
| JP | 56-27140 A | 3/1981 |
| JP | 3-209478 A | 9/1991 |
| JP | 10-265571 A | 10/1998 |
| JP | 10-274850 A | 10/1998 |
| JP | 11-65107 A | 3/1999 |
| JP | 2001-335619 A | 12/2001 |

* cited by examiner

*Primary Examiner*—Amanda C. Walke
(74) *Attorney, Agent, or Firm*—Birch, Stewart, Kolasch & Birch, LLP

(57) ABSTRACT

The present invention relates to a photocurable resin composition, wherein the composition comprises:(A) a polyimide resin having one or more primary alcoholic groups with an alcoholic equivalent equal to or less than 3500, said polyimide being soluble in an organic solvent and having a weight average molecular weight of from 5,000 to 500,000; (B) at least one selected from the group consisting of a condensate of an amino compound modified with formalin, optionally further with alcohol, preferably a melamine resin modified with formalin, optionally further with alcohol, and a urea resin with formalin, optionally further with alcohol, and a phenolic compound having, on average, at least two selected from the group consisting of a methylol group and an alkoxy methylol group, and (C) a photoacid generator capable of generating an acid upon irradiation with light of a wavelength of from 240 nm to 500 nm.

11 Claims, No Drawings

US 7,485,405 B2

PHOTO-CURABLE RESIN COMPOSITION COMPRISING A POLYIMIDE, A PROCESS FOR FORMING A PATTERN THEREWITH, AND A SUBSTRATE PROTECTING FILM

CROSS REFERENCE

This application claims benefits of Japanese Patent Application No. 2004-294470 filed on Oct. 7, 2004, and Japanese Patent Application No. 2005-293029 filed on Oct. 5, 2005, contents of which are incorporated by reference.

FIELD OF THE INVENTION

The present invention relates to a photo-curable resin composition comprising a polyimide, to a process for forming a pattern therewith, and further to a protecting film for circuit using the same. The polyimide is excellent in heat resistance, chemical resistance, an insulating property, and flexibility and, therefore, the present invention particularly relates to a protective insulating film for semiconductor chips, an insulating film for multi-layer printed circuit boards, a solder protecting film, and a coverlay film.

BACKGROUND OF THE INVENTION

As a photosensitive polyimide material, a material using a polyamic acid, a polyimide precursor, is disclosed. For instance, Japanese Patent Application Laid-Open Nos. 49-115541 and 55-45746 describe a material which has a photosensitive group bonded to a carboxyl group of the polyamic acid via an ester bond, and Japanese Patent Application Laid-Open No. 54-145794 describes a material which comprises a polyamic acid and an amine compound having a photosensitive group. In these inventions, however, in order obtain an envisaged polyimide film, a patter is formed on a film and, then, the film is subjected to imidization at a temperature higher than 300 degrees C. This constraints kinds of base substrate and causes oxidation of copper wiring.

To improve above problem by lowering the post-curing temperature, photosensitive polyimide compositions are disclosed in Japanese Patent Application Laid-Open Nos. 10-274850, 10-265571, and 13-335619, in which resins already imidized and soluble in solvents are used. Those polyimide resins of the prior art use (meth)acrylic group to render resins photosensitive and, therefore, are easily damaged by oxygen or cause a reduction in film during development due to a nature of photo-curing mechanism. Thus, it was difficult to improve resolution or to meet all of the desired properties by using polyimide photoresist materials of the prior art.

Meanwhile, a positive photoresist composition comprising a polymer with polyimide skeleton having a phenolic hydroxyl group and diazonaphthoquinone is disclosed in Japanese Patent Application No. 3-209478, and positive photoresist compositions comprising a polymer with polyamide skeleton and diazonaphthoquinone is also disclosed in Japanese Patent Application Nos. 1-46862 and 11-65107. However, it was difficult to obtain a film thicker than 20 microns due to lack of transparency of a film obtained in those cases. Those resins also had other problems: for instance, in order to secure a developing property, a molecular weight of the resin tended to be low; diazonaphthoquinone, a photosensitizing agent, had to be added in a large amount relative to the resin; and it was difficult to exploit an intrinsic curing property of the resin.

SUMMARY OF THE INVENTION

The present invention has been made in view of the above-mentioned situation and provides a photosensitive resin composition comprising a polyimide resin and a film made thereof. The photocurable composition of the present invention provides a fine pattern with a film thickness even larger than 20 microns. The composition is applied, given a pattern and heated at a relatively low temperature such as 200 degrees C. to provide a film which has excellent properties and is reliable as a protecting film.

The present inventors have found that a photo-curable resin composition comprising a polyimide having one or more primary alcoholic groups with an alcohol equivalent of 3500 or less and having a weight average molecular weight of from 5000 to 500,000, which will be described below, may be exposed to a wide range of wavelength and provides a thick film without being damaged by oxygen, that a fine pattern may be formed according to a process for patterning described below, and that the present photo-curable resin composition and the cured film obtained by patterning and subsequent heating are excellent in heat resistance and an electric insulating property, to complete the present invention.

Thus, in an aspect, the present invention provides a photo-curable resin composition, characterized in that the composition comprises:

(A) a polyimide resin having one or more primary alcoholic groups with an alcoholic equivalent of 3500 or less and having a weight average molecular weight of from 5,000 to 500,000;

(B) at least one selected from the group consisting of a condensate of an amino compound modified with formalin, optionally further with alcohol, preferably a melamine resin modified with formalin, optionally further with alcohol, and a urea resin modified with formalin, optionally further with alcohol, and a phenolic compound having, on average, at least two selected from the group consisting of a methylol group and an alkoxy methylol group, and (C) a photoacid generator capable of generating an acid upon irradiation with light of a wavelength of from 240 nm to 500 nm.

In another aspect, the present invention also provides a process for forming a pattern, characterized in that the process comprises the following steps:

(i) a step where the above-described photo-curable composition is applied on a substrate, (ii) a step where the resin composition is exposed through a photomask to light with a wavelength of from 240 nm to 500 nm, and optionally heated thereafter; and (iii) a developing step with a developing solution.

In yet another aspect, the present invention provides a substrate-protecting film obtained by post-curing a film with a pattern formed according to the present process.

Preferably the above-mentioned polyimide resin having one or more primary alcoholic groups with an alcoholic equivalent of 3500 or less and having a molecular weight of from 5,000 to 500,000 is represented by the following formula (1),

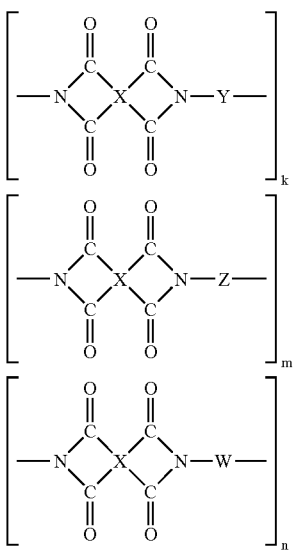

(1)

wherein

X represents a tetravalent organic group,

Y represents a divalent organic group represented by the general formula (2),

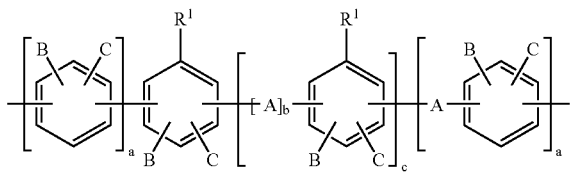

(2)

wherein

A may be same with or different from one another and represents a divalent organic group selected from the following radicals:

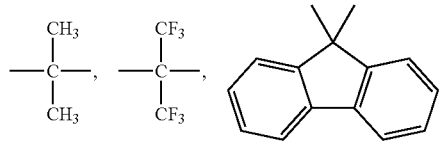

each of B and C may be same with or different from one another and represents a hydrogen atom or an alkyl group having from 1 to 4 carbon atoms, each of a and b is 0 or 1, c is an integer of from 0 to 10, and $R^1$ is a monovalent group selected from the group consisting of a phenolic hydroxyl group, a carboxyl group, and an organic group having an alcoholic hydroxyl group, with at least one $R^1$ being an organic group having an alcoholic hydroxyl group, Z represents a divalent organic group, W represents a divalent organic group having organosiloxane structure, k is a positive number, each of m and n is equal to 0 (zero) or a positive number, with $0.2 \leq k/(k+m+n) \leq 1$, $0 \leq m/(k+m+n) \leq 0.8$, $0 \leq n/(k+m+n) \leq 0.8$.

The photosensitive composition of the present invention comprising a polyimide having one or more primary alcoholic groups is a photo-curable resin composition which may be exposed to light with a wide range of wavelengths, to thereby easily form a thin film without being damaged by oxygen, or a film thicker than 20 micron. It is also possible to form a pattern with high resolution. The cured film obtained from the present composition is excellent in adhesion property, heat resistance, and an insulating property and, therefore, suitably used as a protective insulating film for electric and electronic parts and semiconductor chips.

DESCRIPTION OF THE PREFERRED EMBODIMENTS

The present invention will be elucidated in detail.

The polyimide resin of the present invention having one or more primary alcoholic groups with an alcoholic equivalent of 3500 or less and having a molecular weight of from 5,000 to 500,000 is represented by the following formula (1),

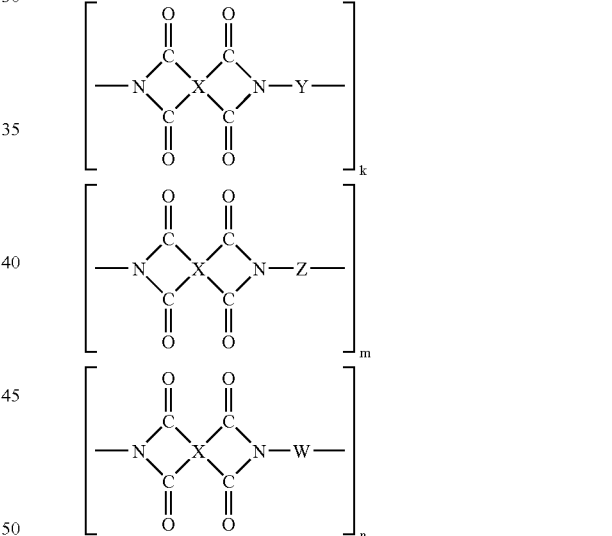

(1)

Preferably, X in the formula (1) represents a tetravalent organic group derived from a residue of tetracarboxylic dianhydride and represented by any one of the following radicals:

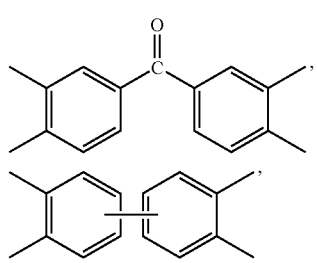

-continued

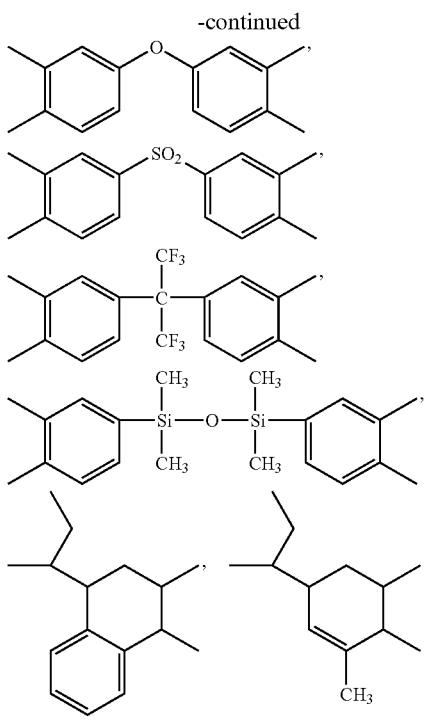

Y in the general formula (1) is a residue originating from diamine having one or more primary alcoholic groups and represented by at least one of the following general formula (2),

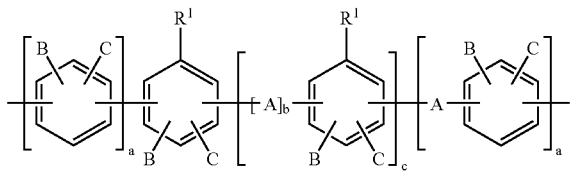

(2)

wherein, A may be a divalent organic group selected from the group consisting of the following radicals:

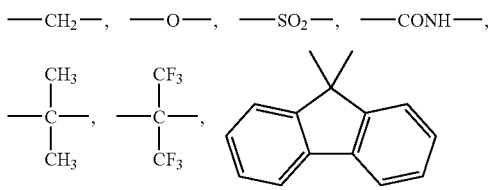

B and C may be same with or different from one another and represents a hydrogen atom, an alkyl or alkoxy group having from 1 to 4 carbon atoms, a and b are 0 (zero) or 1, and c is an integer of from 0 to 10.

$R^1$ in the general formula (2) is selected preferably from the group consisting of a phenolic hydroxyl group, a carboxyl group, and the following monovalent organic radicals having one or more primary alcoholic groups:

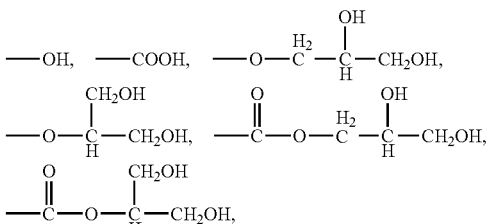

and is in an amount enough to give an alcoholic equivalent of from 200 to 3500, preferably from 300 to 3000.

A polyimide having a residue originating from diamine which has one or more primary alcoholic groups is obtained according to conventional condensation. That is, tetracarboxylic dianhydride is reacted with diamine with $R^1$ being at least one selected from a phenolic hydroxyl group and a carboxyl group in a suitable solvent to obtain a solution of polyamic acid. Then this resin solution is heated to a temperature higher than 100 degrees C. while removing the resulting water from the reaction system to prepare a solution of a polyimide resin. To the thus-obtained solution of a polyimide having at least one selected from a phenolic hydroxyl group and a carboxyl group, an equivalent amount of glycidol is added, and optionally this mixture may be heated to about 100 degrees C., The preparation method is not limited to the method mentioned above.

Specific examples for Y include the following.

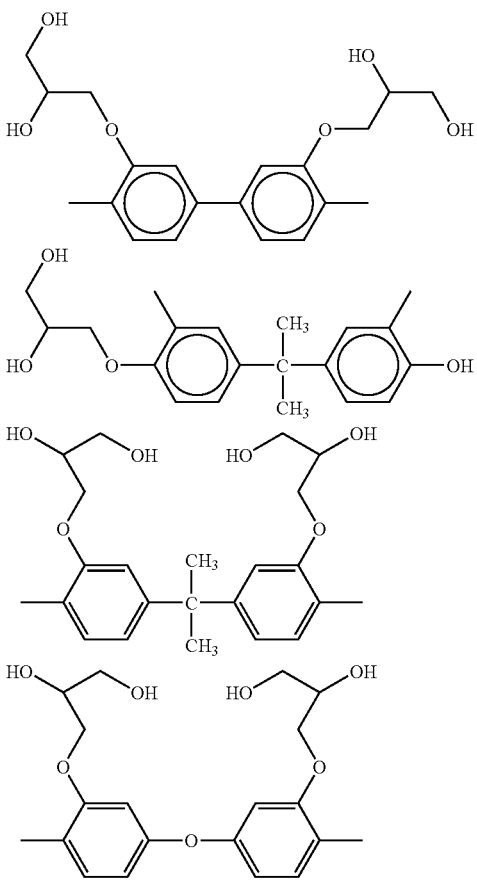

-continued
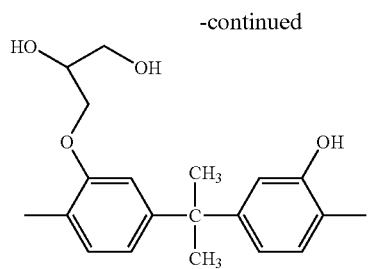
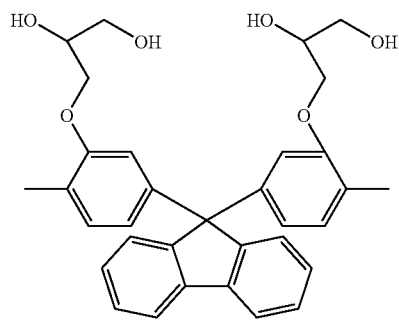
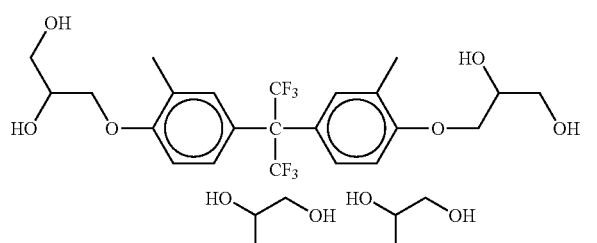
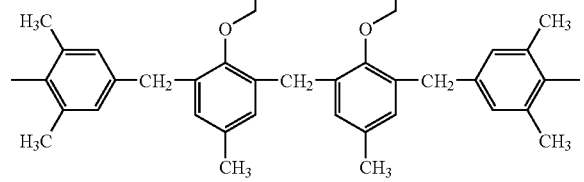
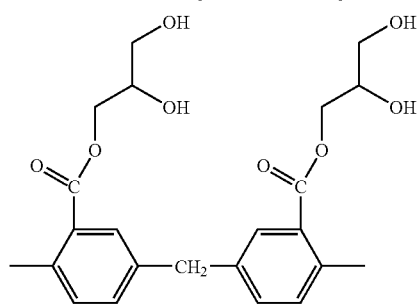
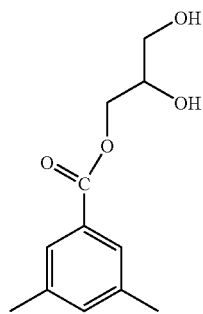
-continued
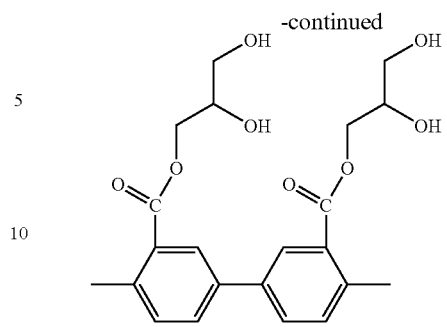
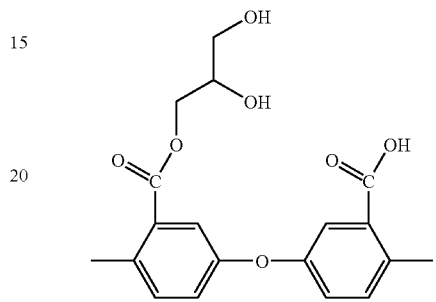
Z in the general formula (1) is preferably selected from radicals represented by the following general formula (3).
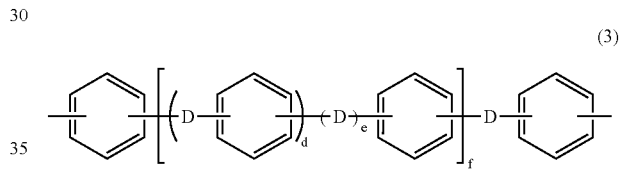
(3)
In the general formula (3), D may be same or different from one another, and is a divalent organic radical selected from the following radicals,
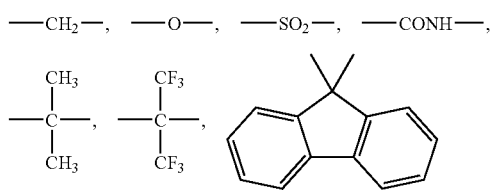
and d, e, and f are 0 or 1.
Specific examples for Z include the following radicals:
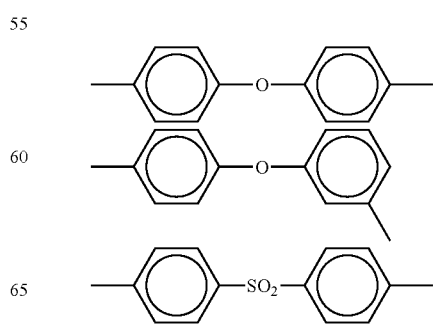

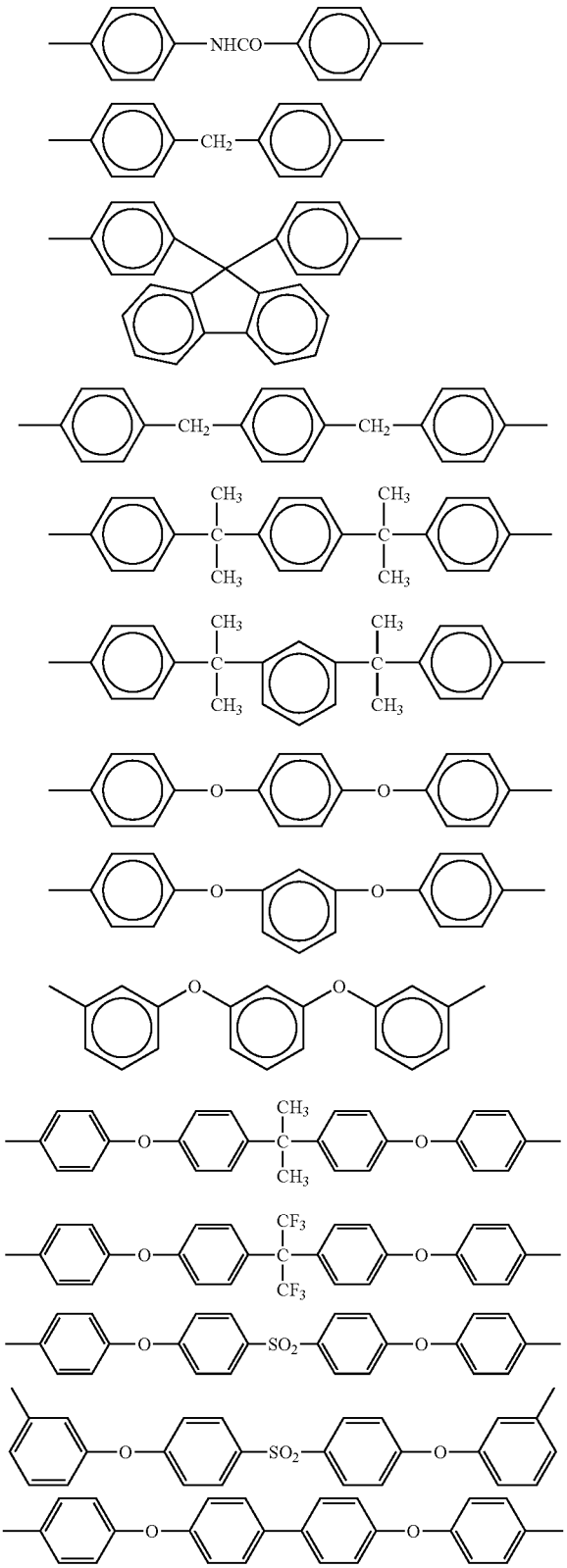

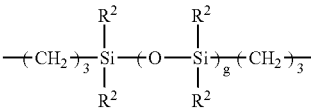

In the general formula (4), $R^2$ may be same with or different from one another and is a monovalent hydrocarbon group having from 1 to 8 carbon atoms. Specific examples include an alkyl group such as methyl, ethyl, propyl, butyl, pentyl, and hexyl groups; a cycloalkyl group such as cyclopentyl and cyclohexyl groups; an aryl group such as a phenyl group; an aralkyl group such as benzyl and phenethyl group; an alkenyl group such as vinyl, allyl, propenyl, isopropenyl, and butenyl groups; and acrylic and methacrylic groups. Preferred are methyl, ethyl, phenyl, and vinyl groups, since raw materials in these cases are easily available. "g" is a positive number of from 1 to 80, preferably from 3 to 70, and more preferably from 5 to 50.

Preferably, k, m, and n in the general formula (1) are zero or positive numbers with $2 \leq k \leq 2000$, $0 \leq m \leq 2000$, and $0 \leq n \leq 2000$ and also satisfy the following: $0.2 \leq k/(k+m+n) \leq 1.0$; $0 \leq m/(k+m+n) \leq 0.8$; and $0 \leq n/(k+m+n) \leq 0.8$. A polyimide with $k/(k+m+n)<0.2$ is not preferred because the envisaged effect by the primary alcoholic hydroxyl group is not sufficiently realized.

The polyimide of the present invention is further preferably such that k is so selected that Y in the general formula (1) has one or more primary alcoholic groups of an amount enough to give an alcoholic equivalent of from 200 to 3500, more preferably from 300 to 3000. If the polyimide has an alcohol equivalent more than the upper limit, photo-curing property is not sufficient, which is undesired. If the polyimide has an alcoholic equivalent less than the lower limit, film properties such as film strength after curing is undesirably low.

The preparation method of the resin (1) is as described in the paragraph where the process for introducing one or more primary alcoholic group, but not limited thereto. In the preparation of the resin (1), aromatic diamine or aliphatic diamine other than diamines represented by the general formulas (3) and (4) may be used, as far as the object of the invention is not impaired.

A molecular weight of the polyimide represented by the general formula (1) is generally from about 5,000 to about 500,000, preferably from 10,000 to 300,000. If the molecular weight is less than the aforesaid lower limit, the film strength of the polyimide resin is undesirably low. Meanwhile, if the molecular weight is more the aforesaid upper limit, the compatibility with a solvent is worse, which is undesired.

The photo-curable resin composition of the present invention comprises:

(A) the polyimide, (B) at least one selected from the group consisting of a condensate of an amino compound modified with formalin, optionally further with alcohol, preferably a condensate of a melamine resin modified with formalin, optionally further with alcohol, and a condensate of a urea resin modified with formalin, optionally further treated with alcohol, and a phenolic compound having, on average, at least two selected from the group consisting of a methylol group and an alkoxy methylol group, and (C) a photoacid generator capable of generating an acid upon irradiation with light of a wavelength of from 240 nm to 500 nm.

In the general formula (1), W is preferably an organosiloxane structure originating from diamine and represented by the following general formula (4).

The (B) component used in the present invention causes the resin (A) to cure and facilitate pattern forming, but also enhances strength of the cured product. The compound of (B) component has a weight average molecular weight from 150 to 10,000, particularly from 200 to 3,000. If the weight average molecular weight of (B) is less than the lower limit, photo-curing may not be enough. If the weight average molecular weight of (B) is more than the upper limit, the heat resistance of the cure composition may be worse.

Examples of the condensates of amino compound modified with formalin, optionally further with alcohol, include a melamine resin modified with formalin, optionally further with alcohol and a urea resin modified with formalin, optionally further with alcohol. A modified melamine is represented by the following general formula (5),

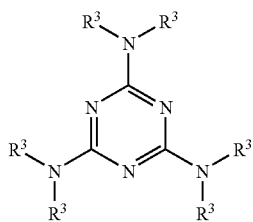

(5)

wherein $R^3$ may be same or different from one another, and selected from the group consisting of a hydrogen atom, a methylol group, and an alkoxymethyl group having from 1 to 4 carbon atoms in the alkoxy moiety, with proviso that at least one $R^3$ is a methylol group or an alkoxymethyl group, and may be prepared according to any known method, for instance by modifying a melamine monomer with formalin into a methylol-substituted melamine, optionally further modifying the methylol group with alcohol.

Examples of $R^3$ described above include a hydrogen atom, a methylol group, and an alkoxymethyl group such as methoxymethyl and ethoxymethyl groups. Specific examples of the modified melamine represented by the general formula (5) include trimethoxymethylmonomethylolmelamine, dimethoxymethylmonomethylolmelamine, trimethylolmelamine, hexamethylolmelamine, and hexamethoxymethylolmelamine.

A modified melamine represented by the general formula (5), including its polymer such as a dimer or a trimer, is then subjected to polyaddition condensation according to known methods until the condensate of melamine modified with formalin, optionally further with alcohol, (B), has a desired molecular weight. As (B), use may be made of at least one selected from the group consisting of monomeric modified-melamines represented by the general formula (5) and their condensates.

According to any known method, urea condensates modified with formalin, optionally further with alcohol may be prepared by modifying urea condensates having a desired molecular weight with formalin into a methylolated urea condensate, then optionally alkoxylating the methylol group with alcohol.

Illustrative examples of the modified urea condensates include methoxymethylated urea condensates, ethoxymethylate urea condensates, and propoxymethylated urea condensates. At least one of these modified urea condensates may be used as (B).

Specific examples of the phenolic compound having, on average, at least two selected from the group consisting of a methylol and an alkoxymethylol groups include (2-hydroxy-5-methyl)-1,3-benzendimethanol and 2,2',6,6'-tetramethoxymethyl bisphenol A.

These amino condensates and phenolic compounds may be used alone or in combination of two or more or them.

The amino condensates or the phenolic compounds as (B) of the present invention may be used in an mount of from 0.5 to 50 parts by mass, particularly from 1 to 30 parts by mass, relative to 100 parts by mass of the polyimide compound (A). If the amount is less than 0.5 part by mass, the curing on irradiation may not be sufficient. Contrary, if the amount exceeds 50 parts by mass, the amount of the polyimide bond in the photo-curable resin composition may be too low to fully develop the effect of the present invention.

The photoacid generating agent (C) is a substance capable of generating acid upon irradiation with light at wavelength of from 240 nm to 500 nm, which acid functions as a catalyst for curing. The resin components of the present invention have a good compatibility with the acid generating agent and, therefore, various kinds of the photoacid generating agent may be used. Illustrative examples of the photoacid generating agent include onium salts, diazomethane derivatives, glyoxime derivatives, beta-ketosulfone derivatives, disulfone derivatives, nitrobenzylsulfonate derivatives, sulfonate derivatives, imide-yl-sulfonate derivatives, oximesulfonate derivatives, iminosulfonate derivatives, and triazine derivatives.

As the onium salts, mention may be made of, for instance, a compound represented by the following general formula (6), $$(R^4)_h M^+ K^- \tag{6}$$

wherein $R^4$ represents a substituted or unsubstituted, linear, branched or cyclic alkyl group having 1 to 12 carbon atoms, an aryl group having 6 to 12 carbon atoms, an aralkyl group having 7 to 12 carbon atoms. $M^+$ represents iodonium or sulfonium, $K^-$ represents a non-nucleophilic counter ion, and h represent an integer, 2 or 3.

Specific examples of $R^4$ include alkyl groups such as methyl, ethyl, propyl, and butyl, cyclohexyl, 2-oxocyclohexyl, norbornyl, and adamantyl groups; aryl groups such as a phenyl group; aryl groups, for instance alkoxyphenyl groups such as o-, m-, and p-methoxyphenyl, o-, m-, and p-ethoxyphenyl, and m- or p-tert-butoxyphenyl groups; and alkyl phenyl groups such as 2-, 3-, 4-methylphenyl, 2-, 3-, 4-ethylphenyl, 4-tert-butylphenyl, 4-butylphenyl, and dimethylphenyl groups; and aralkyl groups such as benzyl and phenetyl groups.

Specific examples of the non-nucleophilic counter ion as $K^-$ include halide ion such as chloride and bromide ion; fluooroalkylsulfonate such as triflate, 1,1,1-trifluoroethanesulfonate, and nonafluorobutanesulfonate; aryl sulfonate such as tosylate, benzenesulfonate, 4-fluorobenzenesulfonate, and 1,2,3,4,5-pentafluorobenzenesulfonate; and alkyl sulfonate such as mesylate and butanesulfonate.

The examples of the diazomethane derivatives include compounds represented by the following general formula (7),

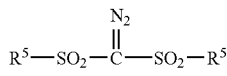

(7)

wherein $R^5$ may be same or different and represents a group selected from the group consisting of a linear, branched or cyclic alkyl and halogenated alkyl groups of 1 to 12 carbon atoms, aryl and halogenated aryl groups of 6 to 12 carbon atoms, and aralkyl groups of 7 to 12 carbon atoms.

Specific examples of the alkyl groups are as methyl, ethyl, propyl, butyl, amyl, cyclopentyl, cyclohexyl, norbornyl, and adamantyl groups.

Specific examples of the halogenated alkyl groups are trifluoromethyl, 1,1,1-trifluoroethyl, 1,1,1-trichloroethyl, and nonafluorobutyl groups. The aryl groups may be a phenyl group; alkoxyphenyl groups such as o-, m- and p-methoxyphenyl, ethoxyphenyl, m-tert-butoxyphenyl and p-tert-butoxyphenyl groups; alkylphenyl groups such as 2-, 3- and 4-methylphenyl, ethylphenyl, 4-tert-butylphenyl, 4-butylphenyl, and dimethylphenyl groups. Examples of halogenated aryl groups include fluorobenzene, chlorobenzen, 1,2,3,4,5-pentafluorobenzen. Examples of aralkyl groups include benzyl group and phenethyl group.

As the glyoxime derivatives, mention may be made of the compound represented by the following general formula (8),

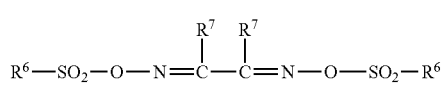

(8)

wherein, $R^6$ and $R^7$ may be same or different from one another and represent a group selected from the group consisting of a linear, branched or cyclic alkyl or halogenated alkyl groups of 1 to 12 carbon atoms, aryl or halogenated aryl groups of 6 to 12 carbon atoms, and aralkyl groups of 7 to 12 carbon atoms. $R^7$s may be a linear or branched alkylene radical of 1 to 6 carbon atoms if they together form a ring structure.

Examples of the alkyl, halogenated alkyl, aryl, halogenated aryl, and aralkyl radicals as $R^6$ and $R^7$ are those mentioned above for $R^5$. Illustrative examples of the alkylene radicals as $R^7$ include methylene, ethylene, propylene, butylene, and hexylene.

Illustrative examples of the photoacid generator (C) include onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoro-methanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, and diphenyl (4-thiophenoxyphenyl)sulfonium hexafluoroantimonate; diazomethane derivatives such as bis(benzenesulfonyl)diazomethane, bis(p-toluenesulfonyl)diazomethane, bis(xylenesulfonyl)diazomethane, bis(cyclohexylsulfonyl) diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl)diazo-methane, bis(sec-amylsulfonyl)diazomethane, bis(tert-amylsulfonyl) diazomethane, 1-cyclohexylsulfonyl1-(tert-butylsulfonyl) diazomethane, 1-cyclohexylsulfonyl-1-(tert-amylsulfonyl) diazomethane, and 1-tert-amylsulfonyl-1-(tert-butylsulfonyl)diazomethane;

glyoxime derivatives such as bis-O-(p-toluenesulfonyl)-alpha-dimethylglyoxime, bis-O-(p-toluenesulfonyl)-alpha-diphenylglyoxime, bis-O-(p-toluenesulfonyl)-alpha-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-alpha-dimethylglyoxime, bis-O-(n-butanesulfonyl)-alpha-diphenylglyoxime, bis-O-(n-butanesulfonyl)-alpha-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-alpha-dimethylglyoxime, bis-O-(trifluoromethanesulfonyl)-alpha-dimethylglyoxime, bis-O-(1,1,1-trifluoroethanesulfonyl)-alpha-dimethylglyoxime, bis-O-(tert-butanesulfonyl)-alpha-dimethylglyoxime, bis-O-(perfluorooctanesulfonyl)-alpha-dimethylglyoxime, bis-O-(cyclohexanesulfonyl)-alpha-dimethylglyoxime, bis-O-(benzenesulfonyl)-alpha-dimethylglyoxime, bis-O-(p-fluorobenzenesulfonyl)-alpha-dimethylglyoxime, bis-O-(p-tert-butylbenzenesulfonyl)-alpha-dimethylglyoxime, bis-O-(xylenesulfonyl)-alpha-dimethylglyoxime, and bis-O-(camphorsulfonyl)-alpha-dimethylglyoxime;

oxime sulfonate derivatives such as a-(benzenesulfonium oxyimino)-4-methylphenylacetonitrile; beta-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoro-methanesulfonyloxy)benzene, and 1,2,3-tris(p-toluene-sulfonyloxy) benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxy-imidoyl n-butylsulfonate, and N-trifluoromethylsulfonyloxy-naphthylimide.

Also preferably used are iminosulfonates such as (5-(4-methylphenyl)sulfonyloxyimino-5H-thiophene-2-ilydene)-(2-methylphenyl)acetonitrile, (5-(4-(4-methylphenylsulfonyloxy)phenylsulfonyloxyimino)-5H-thiophene-2-ilydene)-(2-methylphenyl)-acetonitrile.

The photoacid generator (C) may be used alone or in combination of two or more. The photoacid generator (C) is preferably added in an amount of from about 0.05 to 20 parts by mass, more preferably from 0.2 to 5 parts by mass, relative to 100 parts by mass of the polyimide compound (A). If the amount of a photoacid generator is less than the lower limit, photo-curability may not be sufficiently achieved, whereas the amount exceeds the upper limit photo-curability of a thick film may be adversely affected because of light absorption of the photoacid generator itself.

Optionally an organic solvent (D) may be added to the photo-curable resin composition of the present invention. Preferred are organic solvents that may dissolve the components, i.e. the polyimide resin, the condensate of amino compound modified formalin, optionally further with alcohol, and the photoacid generator.

Illustrative examples of the organic solvent include ketones such as cyclohexanone, cyclopentanone and methyl-2-n-amylketone; alcohols such as 3-methoxybutanol, 3-methyl-3-methoxy-butanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, gamma-butyrolactone, N-metyl-2-pyrrolidone, and N,N-dimethylacetamide. The solvent may be used alone or in combination of two or more.

Among these solvents, most preferred are ethyl lactate, cyclohexanone, cyclopentanone, gamma-butyrolactone, and N,N-dimethylacetamide, and their mixture.

The organic solvent (D) may be used in an amount of from 50 to 2,000 part by mass, particularly from 100 to 1,000 parts by mass relative to 100 parts by mass of a total of (A), (B), and (C). If the amount of the organic solvent is less than the lower limit, the compatibility with (A)-(C) may not be sufficient. If the amount of an organic solvent exceeds the upper limit, the compatibility may not be improved much further and the viscosity of the resin composition may be too low to be applied.

In addition to the above-described components, the photo-curable resin composition of the invention may further comprise conventional additives. A conventional surfactant may be added, for instance, for improving coating property. As the surfactant, nonionic surfactants are preferred such as perfluoroalkyl polyoxyethylene ethanols, fluorinated alkyl esters, perfluoroalkylamine oxides, and fluorinated organosiloxane compounds.

They are commercially available. Illustrative examples include Florade FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from Dainippon Ink & Chemicals, Inc., and X-70-093 from Shin-Etsu Chemical Co., Ltd. Preferred surfactants are Florade FC-4430 from Sumitomo 3M Ltd., and X-70-093 from Shin-Etsu Chemical Co., Ltd.

As the conventional additives, light absorber may be added for improving light absorption efficiency. Suitable light absorbers include, for example, diaryl sulfoxide, diaryl sulfone, 9,10-dimethylanthracene and 9-fluorenone. Besides, also may be added are basic compounds, for instance, tertiary amines such as triethanolamine, nitrogen atom-containing compounds such as benzotriazole and pyridine, silane coupling agents for improving an adhesion property, for instance, an epoxy silane coupling agent such as KBM-403 available from Shin-Etsu Chemical Co., Ltd. Besides, when the photo-curable resin composition of the invention is used as a resist material, any additive which is commonly employed in resist materials may be used. The additives may be added in a conventional amount as far as the addition does not interfere with the effect of the present invention.

Any desired method may be used in preparing the photo-curable resin composition of the invention. It is generally prepared by mixing the above-described components and, optionally, the organic solvent and additives, and filtering the mixture through a filter to remove any solid.

The photo-curable resin compositions of the invention thus prepared are advantageously used as a material for protective films for semiconductor chips, insulating films for circuits, coverlay films, and solder resist, and even for micro-patterning photoresist.

A process for forming a pattern using the photo-curable resin composition of the invention comprises the following steps:

(i) a step where the photo-curable resin composition is applied on a substrate, for instance, by coating or other methods, (ii) a step where the resin composition is exposed to light having a wavelength of 150 to 450 nm through a photomask, optionally, heated, which heating is called a post-exposure baking process (PEB process) and (iii) a step where the resin film is developed with an organic developer solution.

After a pattern is formed according the three steps, the film is subjected to (iv) heating for post-curing to obtain an envisaged protecting film.

A typical substrate used in step (i) is silicon wafers, plastics, and circuit boards made of ceramics. Alternatively the resin composition solution may be separately formed into a film and the resulting film may be bonded to a substrate.

The coating technique may be any well-known techniques employed in the lithography technology. Examples include dipping, spin coating, and roll coating. The coating amount of the composition may be suitably chosen for a particular purpose and usually in an amount sufficient to give a film thickness of 0.1 to 100 micrometers.

In order that the photo-curing reaction takes place efficiently, the film may be preheated for causing the solvent to evaporate. The preheating may be performed, for example, at a temperature of from 40 to 140 degrees C. for about 1 minute to 1 hour. The film is then exposed to light of a wavelength of 150 to 450 nm through a photomask to cause the film to cure. The photomask may have a desired pattern. The photomask is preferably made of a material that shields light of a wavelength of 240 to 500 nm, for example, chromium, to which the material is not limited.

Examples of the light of a wavelength of 240 to 500 nm include lights having different wavelengths emitted by a radiation generator, for example, UV light, such as g and i-lines, and deep UV light (248 nm). The preferred dose is, for example, 10 to 2000 mJ/cm$^2$. Here, if desired for further enhancing development sensitivity, the film may be heated after exposure. The heat treatment after exposure may be performed, for example, at 40 to 140 degrees C. for 0.5 to 10 minutes.

After the exposure or the optional heat treatment after the exposure, the film is developed with a developer. A preferred developer used herein may be conventional organic solvents, such as dimethylacetamide and cyclohexanone. The development can be carried out by a conventional technique, for example, by immersing the film with a pattern in the developer. In this way, a film formed from a composition and having the predetermined pattern is obtained. The pattern forming process is as described above, optionally followed by washing, rinsing and drying. If it is unnecessary to form a pattern, that is, if it is desired to form a uniform film, the above-mentioned pattern forming process may be performed without the photomask.

The thus-obtained patterned film may be heated in an oven or on a hot plate at 120 to 300 degrees C. for about 10 minutes to about 10 hours, whereby crosslinking density may be increased and any residual volatiles may be removed, so that the film may be further improved in adhesion to substrates, heat resistance, strength and electrical properties.

THE EFFECTS OF THE INVENTION

The cured film obtained from the photo-curable resin composition has an improved adhesion toe substrates, heat resistance, and electrical insulating properties and is advantageously used as a protective film for electric and electronic parts and semiconductor devices. The film of the present invention may be formed with a fine pattern and, therefore, may be used as a protecting film for semiconductor devices, a protecting film for circuits, coverlay film and solder resist.

EXAMPLES

The present invention will be elucidated with reference to the Preparation Examples, the Examples, and the Comparative Examples but shall not be limited thereto. In the following examples, "part" shall be construed as "part by mass".

Preparation of a Polyimide Resin Solution

Preparation Example 1

In a flask equipped with a stirrer, a thermometer, nitrogen purge equipment, and an ester adaptor, were added 44.4 g of 2,2-bis(3,4-benzenedicarboxylic anhydride)perfluoropropane and 200.0 g of cyclohexanone as a solvent. Subsequently, to the above-mentioned flask was added dropwise 36.6 g of 2,2-bis(3-hydroxyl-4-aminophenyl)perfluoropropane dissolved in 124.0 g of cyclohexanone, while stirring the reaction mixture. After the completion of the addition, the reaction mixture was further stirred for 10 hours. Then, 50.0 g of toluene was added and the reaction system was heated to 150 degrees C. for 6 hours, during which 3.5 g of water was recovered via the ester adaptor. Then the reaction system was cooled to room temperature to obtain a solution containing the polyimide resin having repeating units represented by the formula (9).

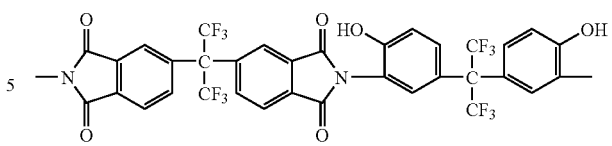

The IR absorption spectra of this resin did not show absorption based on polyamic acid, but instead showed absorption at 1780 cm$^{-1}$ and 1720 cm$^{-1}$ based on a imide group and absorption around 3400 cm$^{-1}$ based on a phenol group. The weight average molecular weight was 45,000, reduced to polystyrene, as determined by gel permeation chromatography (GPC) using tetrahydrofuran as a solvent.

Then to a flask, were added 220.0 g of the thus-obtained polymer solution having a resin solid content of 17.6%, and 7.4 g of glycidol and the reaction mixture was heated at 120 degrees C. for 6 hours. Then, the reaction mixture was cooled to room temperature and poured into 1 liter of methanol. The resulting precipitate was dried at 40 degrees C. under reduced pressure to recover 42.5 g of the resin. As a result of NMR analysis on this polymer, it was found that the peak at 10.1 ppm based on the phenolic hydroxyl group decreased to 15% of that of the starting resin and, instead, peaks based on a primary alcohol and a secondary alcohol appeared at 4.6 ppm and 4.8 ppm, which indicates that a polymer had repeating units represented by the formula (10). NMR analysis on this polymer showed that the primary alcohol equivalent of this resin was 530. The weight average molecular weight of this resin was 47,000.

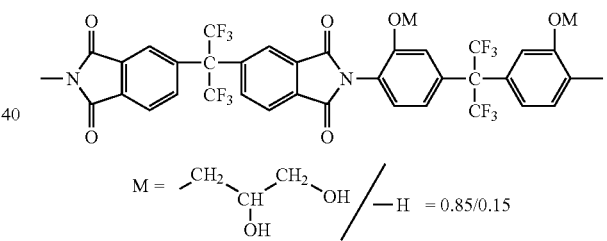

20.0 g of the thus-obtained resin was dissolved in 45.0 g of cyclohexanone and used as A-1 in the following Examples.

Preparation Example 2

The procedures of the Preparation Example 1 was repeated, except that use was made of 35.8 g of (2,3-dicarboxylphenyl)sulfone dianhydride as the tetracarboxylic dianhydride, 34.6 g of 2,2'-methylenebis(4-metyl-6-(3,5-dimethyl-4-aminobenzyl)phenol and 25.2 g of diaminosiloxane having the structure represented by the general formula (4), wherein g=9.0 as the diamine, and 370 g of gamma-butyrolactone and 50.0 g of toluene as solvents. 470 of a resin solution containing a polyimide resin having a phenolic group was obtained with a resin solid content of 19.6%. To the resin solution, 11.0 g of glycidol was added and heated at 120 degrees C. for 10 hours. Then almost all of the phenolic groups reacted with the epoxy group to give 480 g of a solution containing the resin having primary alcoholic groups and represented by the following formula (11), referred to as resin solution B-1. The primary alcoholic equivalent of the resin was 731 and the weight average molecular weight was 28,000.

dimetyhlacetamide and 50.0 g of toluene as the solvent. 320 of a resin solution containing a polyimide resin having a phenolic group was obtained with the resin solid content of

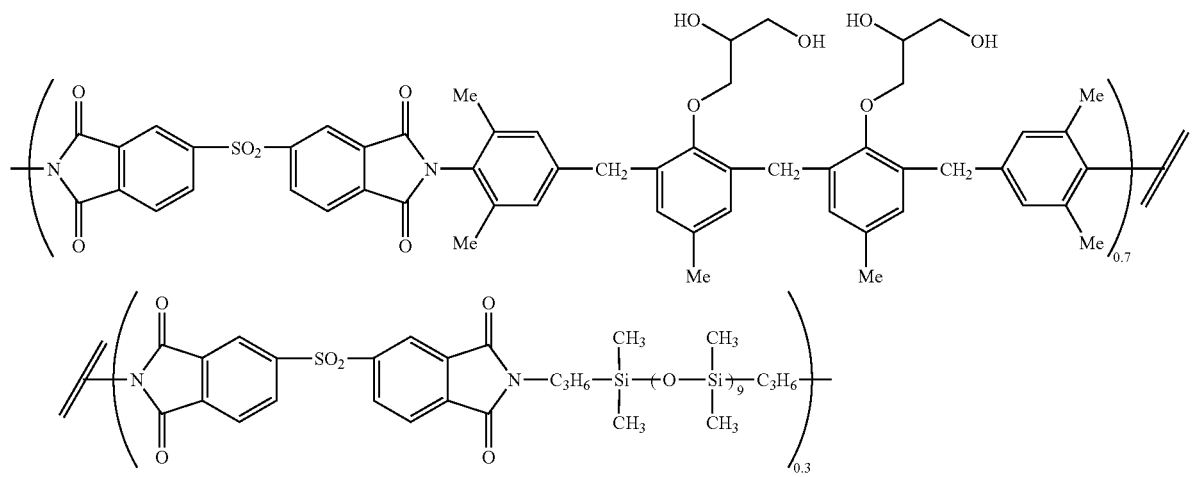

(11)

Preparation Example 3

The procedures of Preparation Example 1 was repeated, except that use was made of 31.0 g of 4,4'-oxydiphthalic anhydride as the tetracarboxylic dianhydride, 7.7 g of 2,2'-bis(4-amino-3-hydroxyphenyl)propane, 20.5 g of 2,2'-bis[4-(4-aminophenoxy)phenyl]propane, and 5.0 g of diaminosiloxane having a structure represented by the general formula (4), wherein g=1, both as the diamine, and 240.0 g of 19.0%. To this resin solution, 4.6 g of glycidol was added and heated at 120 degrees C. for 10 hours. Then almost all of the phenolic group reacted with the epoxy group to give 324 g of a solution containing the resin having primary alcoholic groups and represented by the following formula (12), referred to as resin solution C-1. The primary alcoholic equivalent of the resin was 1084 and the weight average molecular weight was 120,000.

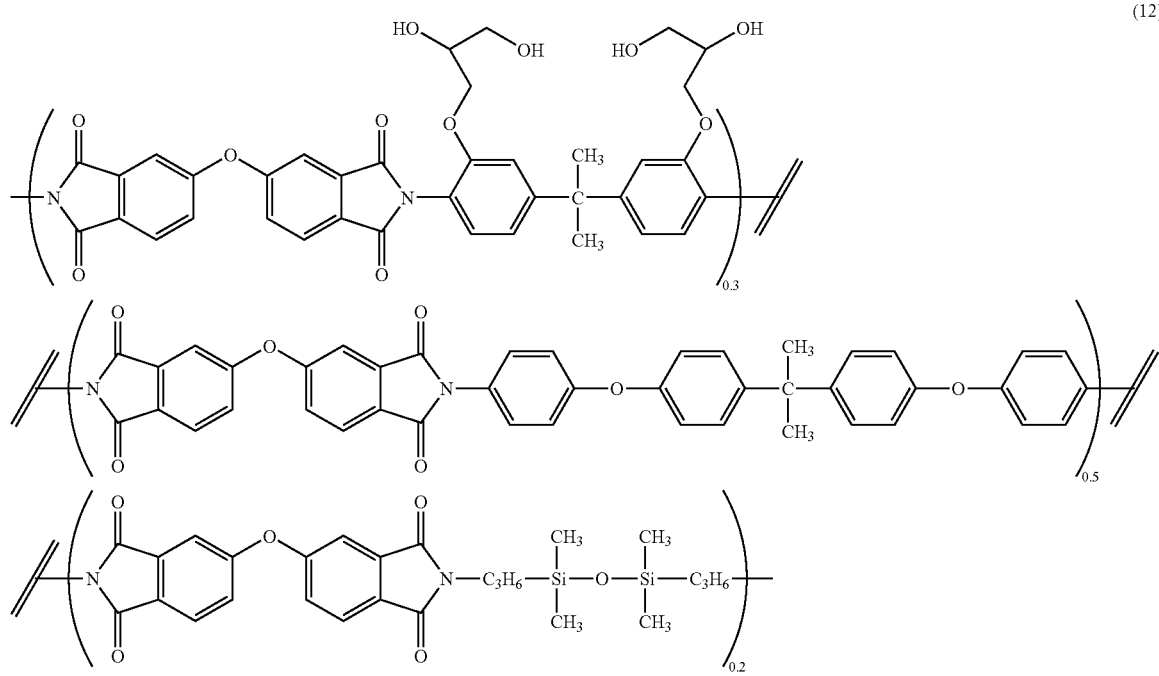

(12)

Preparation Example 4

The procedures of Preparation Example 1 was repeated, except that use was made of 44.4 g of 2,2-bis(3,4-benzendicarboxylic anhydride)perfluoropropane as the tetracarboxylic dianhydride, 5.4 g of 4,4''-diaminobiphenyl)-3,3'-dicarboxylic acid and 32.8 g of 2,2'-bis[4-(4-aminophenoxy)phenyl]propane as the diamine, and 340 g of dimetyhlacetamide and 50.0 g of toluene as the solvent. 343 of a resin solution containing a polyimide resin having a carboxyl group was obtained with a resin solid content of 23.0%.

To this resin solution, 3.0 g of glycidol was added and heated at 100 degrees C. for 10 hours. Almost all of the carboxyl groups reacted with the epoxy group to give 346 g of a solution containing the resin having a primary alcoholic group and represented by the following formula (13), referred to as resin solution D-1. The primary alcoholic equivalent of the obtained resin was 2050 and the weight average molecular weight was 21,000.

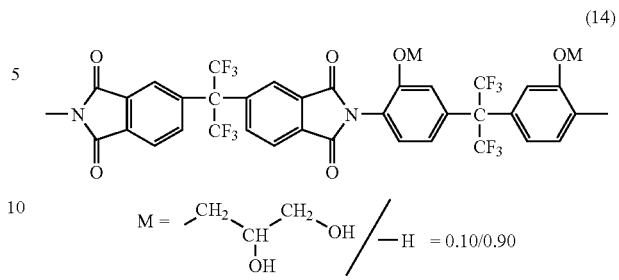

Example

Photo-curable resin compositions of the present invention were obtained by combining and mixing the polyimide resin solutions prepared in Preparation Examples 1 to 4 mentioned

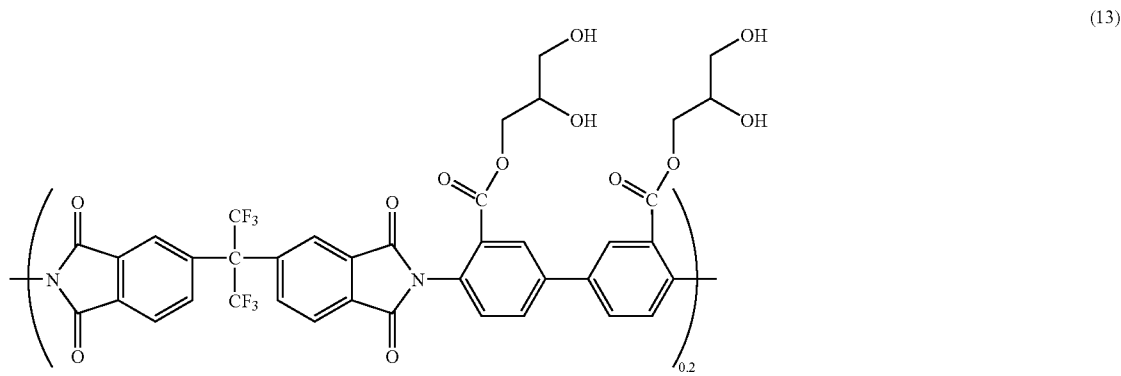

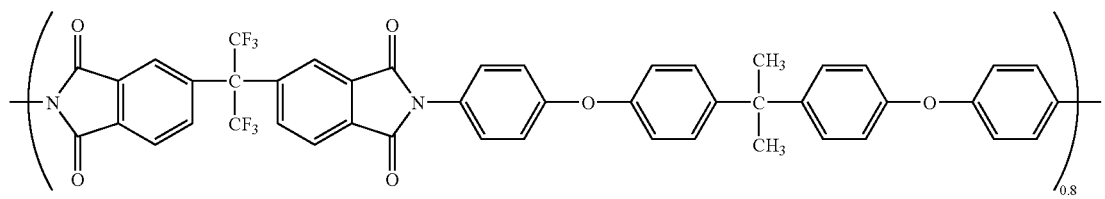

Preparation Example 5

0.15 g of glycidol was added to 44.0 g of the resin solution in cyclohexanone, which resin solution was obtained in Preparation Example 1 and contained the resin represented by the formula (9) with a resin solid content of 17.6%. The reaction took place according to the procedures of Preparation Example 1, except that the heating was performed at 120 degrees C. for 10 hours. A resin solution containing a resin represented by the following formula (14) with a resin solid content of 17.9%, referred to as A-2, was obtained. The primary alcohol equivalent of the resin was 3944 and the weight average molecular weight was 45,000.

above, a cross-linking agent, a photoacid generating agent, other additives, and a solvent in the amounts indicated in Table 1, with stirring to dissolve, followed by fine filtration with a 0.2 micron filter made of Teflon. For comparison, a resin solution, E-1, was prepared by dissolving in cyclohexanone the resin represented by the general formula (9), which was prepared in Preparation Example 1 as an intermediate product to obtain the resin represented by the formula (10), in such an amount that a resin solid content of 20.0% is obtained.

Then, each composition thus prepared was applied, in a film thickness indicated in Table with a spin coater on two pieces of 6-inch silicon wafers which had been treated with a primer hexamethyldisilazane and on a piece of copper substrate which had been prepared by electrically plating the whole surface of a silicon wafer with copper in a plate thickness of 6 microns. Among three pieces of wafer, a piece of the silicon wafer was heated to dry at 100 degrees C. on a hot plate for 2 minutes to remove the solvent. Then through a mask made of quartz and having regularly spaced lines of from 1-micron to 20-micron width, the silicon wafer was irradiated with light of the wavelength and the light exposure indicated in Table 1. Here, NSR-1755i7A means a stepper exposure from Nikon Corporation, and PLA-600FA means a contact aligner exposure from Canon Inc. After the irradiation, the wafer was heated at 80 degrees C. for 1 minute and then cooled.

Subsequently, the wafer was dipped in dimethylacetamide for three minutes for development. The line width developed in this procedure is summarized in Table 1. The film thickness after the developing is also summarized. The other piece of the silicon wafer and the copper substrate were also coated with the compositions of the Examples described in Table 1 under the same conditions and pre-baked to remove the solvent. Then the whole surface of the substrates was irradiated without the mask made of quartz, followed by heating and dipping in dimethylacetamide. After these procedures, the remaining film was further baked in an oven at 200 degrees C. for three hours to obtain a cured film. The insulating property and the adhesion property of the cured films were determined. The results are shown in Table 2.

The photoacid generators, PG-1 to PG-3, in Table 1 are the following compounds

PG-1:

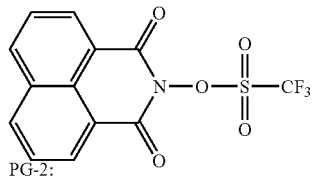

PG-2:

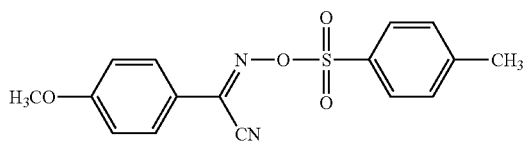

PG-3:

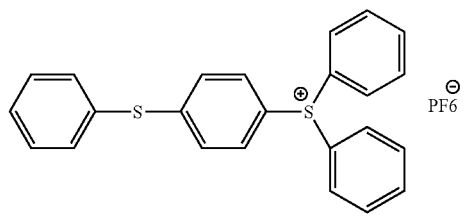

The cross-linking agents, CL-1 to CL-3, are the following compounds:

TABLE 1

| | Composition | | | | | | | |
|---|---|---|---|---|---|---|---|---|
| Example | Resin Solution | Photoacid Generator | Cross-linking Agent | Other Additives | Dried Film Thickness after Spin Coating | Light Source/Dose | Film Thickness after Development | Resolution |
| Ex. 1 | A-1 100 parts | PG-1 0.3 part | CL-1 3.1 parts | FC-4430 0.02 part KBE-403 0.1 part | 18.0 microns | NSR-1755i7A, 365 nm/ 300 mJ/cm2 | 17.6 microns | 15 microns Line Resolution |
| Ex. 2 | A-1 100 parts | PG-2 0.3 part | CL-3 4.6 parts | FC-4430 0.02 part KBE-403 0.1 part | 22.0 microns | NSR-1755i7A, 365 nm/ 350 mJ/cm2 | 21.6 microns | 15 microns Line Resolution |
| Ex. 3 | A-1 100 parts | PG-3 0.3 part | CL-2 3.1 parts | FC-4430 0.02 part KBE-403 0.1 part cyclohexanone 100 parts | 1.2 microns | PLA-600FA, Xe—Hg lamp, 270 nm~320 nm/ 105 mJ/cm2 | 1.2 microns | 1 micron Line Resolution |
| Ex. 4 | B-1 100 parts | PG-1 0.2 part | CL-1 1.3 parts | X-70-093 0.02 part | 8.0 microns | PLA-600FA, 365 nm~436 nm/ 360 mJ/cm2 | 7.9 microns | 6 microns Line Resolution |
| Ex. 5 | C-1 100 parts | PG-2 0.6 part | CL-1 3.0 parts | X-70-093 0.02 part | 11.5 microns | NSR-1755i7A, 365 nm/ 400 mJ/cm2 | 11.3 microns | 8 microns Line Resolution |
| Ex. 6 | D-1 100 parts | PG-2 0.2 part | CL-1 2.0 parts | X-70-093 0.02 part KBE-403 0.3 part cyclohexanone 50 parts | 0.8 micron | NSR-1755i7A, 365 nm/ 100 mJ/cm2 | 0.8 micron | 1 micron Line Resolution |
| Com. Ex. 1 | A-2 100 parts | PG-1 0.2 part | CL-1 2.0 parts | FC-4430 0.02 part KBE-403 0.1 part | 6.0 microns | NSR-1755i7A, 365 nm/ 1000 mJ/cm2 | No Pattern Formed, Remaining film: 0 micron | — |
| Com. Ex. 2 | E-1 100 parts | PG-1 0.2 part | CL-1 2.0 parts | FC-4430 0.02 part | 11.0 microns | NSR-1755i7A, 365 nm/ 1000 mJ/cm2 | No Pattern Formed, Remaining film: 0 micron | — |

CL-1:
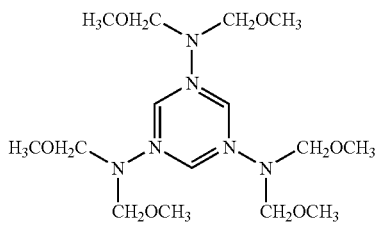

CL-2:
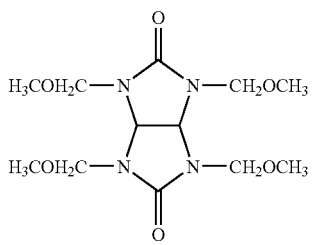

CL-3:
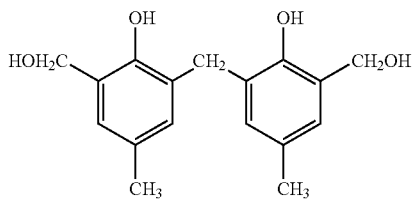

The other additives used are as follows:

FC-4430: fluorinated surfactant, trade name from Sumitomo 3 M Co., Ltd.

KBE-403: epoxy-modified alkoxysilane adhesive adjuvant, trade name from Shin-Etsu Chemical Co., Ltd.

X-70-093: fluorinated silicone surfactant, trade name from Shin-Etsu Chemical Co., Ltd.

TABLE 2

| | Adhesion Property | | Electric Property |
| Example | Si Wafer | Copper Substrate | Dielectric Breakdown Strength |
| --- | --- | --- | --- |
| Example 1 | 0/100 | 0/100 | 300 V/μm |
| Example 2 | 0/100 | 0/100 | 300 V/μm |
| Example 3 | 0/100 | 0/100 | 300 V/μm |
| Example 4 | 0/100 | 0/100 | 300 V/μm |
| Example 5 | 0/100 | 0/100 | 250 V/μm |
| Example 6 | 0/100 | 0/100 | 300 V/μm |

The adhesion property in Table 2 described above was determined by leaving a substrate in a pressurized cooker with 100% humidity at 2 atoms for 24 hours, then submitting it to the cross hatch test to count the number of peeled-off sections. The measurement method of dielectric breakdown strength is based on JIS C2103.

The results described above show that the films prepared from the compositions of Examples 1 to 6 do not cause reduction in film thickness when the film thickness is in a range of from about 1 micron to 20 microns or more, exhibit good resolution, and provide good properties enough as a photosensitive material. The cured films have good adhesion to various substrates, good electric property such as dielectric breakdown strength and, therefore, are useful as a protecting film for electric circuits and electric parts.

The invention claimed is:

1. A photo-curable resin composition, characterized in that said composition comprises:
   (A) a polyimide resin having one or more primary alcoholic groups with an alcoholic equivalent equal to or less than 3500, said polyimide being soluble in an organic solvent and having a weight average molecular weight of from 5,000 to 500,000;
   (B) at least one selected from the group consisting of a condensate of an amino compound modified with formalin, optionally further with alcohol, preferably a melamine resin modified with formalin, optionally further with alcohol and a urea resin with formalin, optionally further with alcohol, and a phenolic compound having, on average, at least two selected from the group consisting of a methylol group and an alkoxy methylol group, and
   (C) a photoacid generator capable of generating an acid upon irradiation with light of a wavelength of from 240 nm to 500 nm.

2. The photo-curable resin composition according to claim 1, characterized in that said composition comprises 100 parts by mass of (A), from 0.5 to 50 parts by mass of (B), and from 0.05 to 20 parts by mass of (C).

3. The photo-curable resin composition according to claim 1, characterized in that said composition further comprises from 50 to 2,000 parts by mass of an organic solvent(D), relative to 100 parts by mass of a total amount of (A), (B), and (C).

4. The photo-curable resin composition according to claim 1, characterized in that the polyimide resin (A) is represented by the following general formula (1),

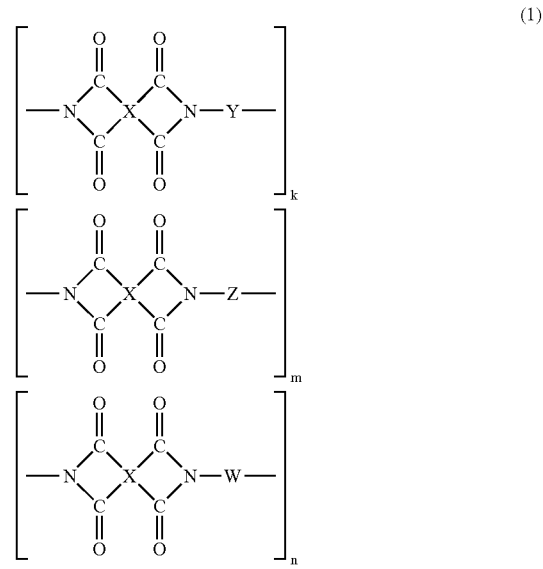

wherein

X represents a tetravalent organic group,

Y represents a divalent organic group represented by the general formula (2) and has one or more primary alcoholic groups of an amount enough to give an alcoholic equivalent equal to or less than 3500,

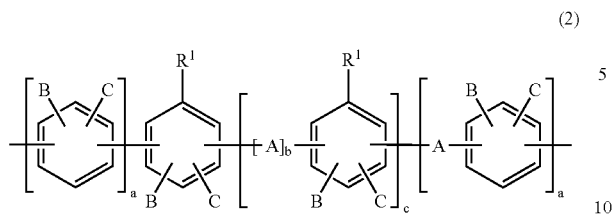
(2)

wherein,

A may be same with or different from one another and represents a divalent organic group represented by any one selected from the following radicals:

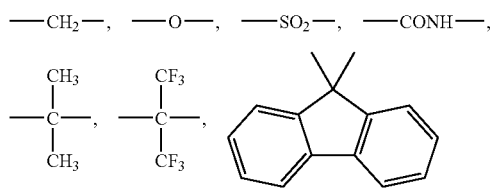

each of B and C may be same with or different from one another and represents a hydrogen atom, or an alkyl or alkoxy group having from 1 to 4 carbon atoms, each of a and b is 0 or 1, c is an integer of from 0 to 10, and $R^1$ is a monovalent group selected from the group consisting of a phenolic hydroxyl group, a carboxyl group, and an organic group having a primary alcoholic hydroxyl group, with at least one $R^1$ being an organic group having a primary alcoholic hydroxyl group, and Z represents a divalent organic group, W represents a divalent organic group having organosiloxane structure, k is a positive number, and each of m and n is equal to 0 (zero) or a positive number, with $0.2 \leq k/(k+m+n) \leq 1.0$, $0 \leq m/(k+m+n) \leq 0.8$, $0 \leq n/(k+m+n) \leq 0.8$.

5. The photo-curable resin composition according to claim 4, characterized in that $R^1$ in the general formula (2) is selected from the group consisting of the following radicals,

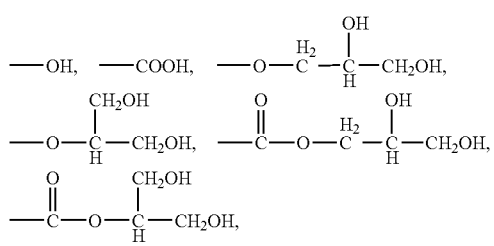

and being in an amount enough to give an alcoholic equivalent equal to or less than 3500.

6. The photo-curable resin composition according to claim 4, characterized in that X in the general formula (1) is selected from the group consisting of the following radicals:

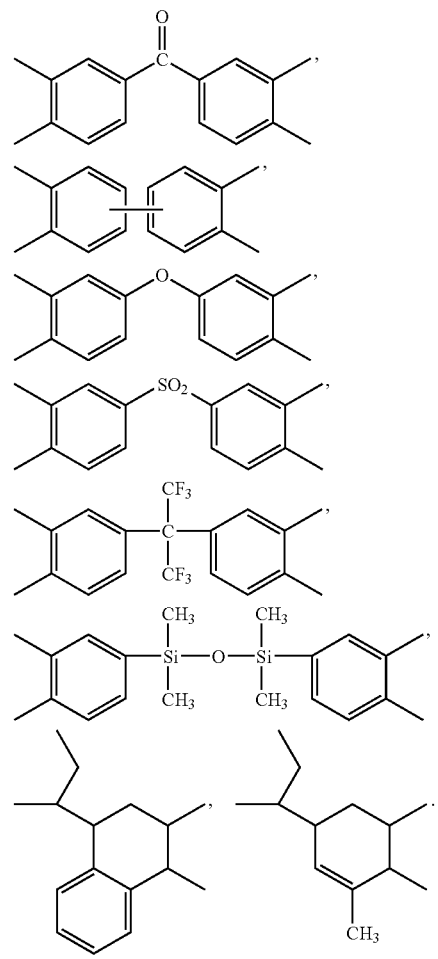

7. The photo-curable resin composition according to claim 4, characterized in that Z in the general formula (1) is represented by the general formula (3),

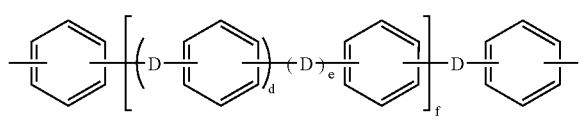
(3)

wherein D may be same with or different from one another, and is a divalent organic group selected from the group consisting of the following radicals,

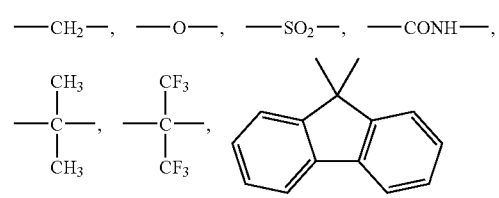

and d, e, and f are 0 (zero) or 1.

8. The photo-curable resin composition according to claim 4, characterized in that W in the general formula (1) is represented by the following general formula (4),

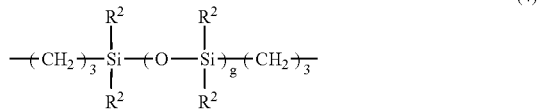

wherein, $R^2$ may be same or different from one another and is selected from monovalent hydrocarbon radicals having from 1 to 8 carbon atoms and g is a positive number of from 1 to 80.

9. The photo-curable resin composition according to claim 4, characterized in that said polyimide is a siloxane-modified polyimide, with $3 \leqq n \leqq 400$ in the general formula (1).

10. A process for forming a pattern, characterized in that said process comprises the following steps:
(i) a step where the photo-curable resin composition according to claim 1 is applied to a substrate;
(ii) a step where the resin composition is exposed through a photomask to light with a wavelength of from 240 nm to 500 nm, and optionally heated thereafter; and
(iii) a developing step with an organic developer solution.

11. A protecting film obtained by post-curing the film provided with a pattern formed according to claim 10, at a temperature of from 120 degrees C. to 300 degrees C.

* * * * *